United States Patent
Kim et al.

(10) Patent No.: US 11,961,720 B2
(45) Date of Patent: Apr. 16, 2024

(54) DEVICE FOR DETECTING PLASMA OF ULTRA FAST WITH MULTI CHANNEL

(71) Applicant: T.O.S Co., Ltd., Osan-si (KR)

(72) Inventors: Yong Kyu Kim, Suwon-si (KR); Bum Ho Choi, Goyang-si (KR); Yong Sik Kim, Suwon-si (KR); Kwang Ki Kang, Osan-si (KR); Hong Jong Jung, Osan-si (KR); Seok Ho Lee, Pyeongtaek-si (KR); Seung Soo Lee, Suwon-si (KR)

(73) Assignee: T.O.S Co., Ltd., Gyeonggi-do (KR)

( * ) Notice: Subject to any disclaimer, the term of this patent is extended or adjusted under 35 U.S.C. 154(b) by 308 days.

(21) Appl. No.: 17/499,034

(22) Filed: Oct. 12, 2021

(65) Prior Publication Data

US 2022/0223389 A1    Jul. 14, 2022

(30) Foreign Application Priority Data

Jan. 11, 2021    (KR) .................. 10-2021-0003397

(51) Int. Cl.
  *H01J 37/32*        (2006.01)
  *H05H 1/00*         (2006.01)

(52) U.S. Cl.
  CPC ..... *H01J 37/32944* (2013.01); *H01J 37/3211* (2013.01); *H05H 1/0081* (2013.01)

(58) Field of Classification Search
  CPC ............ H01J 37/32944; H01J 37/3211; H05H 1/0081
  See application file for complete search history.

(56) References Cited

U.S. PATENT DOCUMENTS

| 2004/0031699 A1* | 2/2004 | Shoji ................. H01L 21/6833 205/791.5 |
| 2011/0109530 A1* | 5/2011 | Nonomura ........ H01J 37/32935 345/60 |
| 2021/0063461 A1* | 3/2021 | Basson .................. H01J 37/20 |

FOREIGN PATENT DOCUMENTS

| CN | 100385620 C  * | 4/2008 | ........ H01J 37/32623 |
| JP | 2007073309 A  * | 3/2007 | ......... H01L 21/6833 |
| KR | 101957661 B1 * | 3/2019 | |

* cited by examiner

*Primary Examiner* — Harry R Behm
(74) *Attorney, Agent, or Firm* — Finch & Maloney PLLC

(57) ABSTRACT

Disclosed herein is a multi-channel device for detecting plasma at an ultra-fast speed, including: a first antenna module connected to a first output terminal in contact with a substrate on a chuck of a process chamber and extending to ground, and receiving a first leakage current leaking through the substrate to increase reception sensitivity of the leakage current; a first current detection module detecting the first leakage current; a current measurement module receiving the first leakage current output from the first current detection module, and extracting the received first leakage current for each predetermined period to generate a first leakage current measurement information; and a control module comparing the first leakage current measurement information with a reference value to generate first arcing occurrence information.

13 Claims, 10 Drawing Sheets

FIG. 11

|  | FIRST ARCING OCCURRENCE INFORMATION (FIRST LEAKAGE CURRENT) | SECOND ARCING OCCURRENCE INFORMATION (SECOND LEAKAGE CURRENT) | THIRD ARCING OCCURRENCE INFORMATION (PLASMA OPTICS) | FOURTH ARCING OCCURRENCE INFORMATION (SYNTHESIS) |
|---|---|---|---|---|
| FIRST STATE | NORMAL | NORMAL | NORMAL | NORMAL |
| SECOND STATE | SOFT ARCING | NORMAL | NORMAL | NORMAL |
| THIRD STATE | SOFT ARCING | SOFT ARCING | NORMAL | SOFT ARCING |
| FOURTH STATE | HARD ARCING PREDICTION | HARD ARCING PREDICTION | SOFT ARCING | HARD ARCING PREDICTION |
| FIFTH STATE | SOFT ARCING | HARD ARCING | HARD ARCING | HARD ARCING |
| . | . | . | . | . |
| . | . | . | . | . | form
DEVICE FOR DETECTING PLASMA OF ULTRA FAST WITH MULTI CHANNEL

CROSS REFERENCE TO RELATED APPLICATION

This application claims the benefit of Korean Patent Application No. 10-2021-0003397, filed on Jan. 11, 2021, which is hereby incorporated by reference in its entirety into this application.

BACKGROUND

Field

The present disclosure relates to a multi-channel device for detecting plasma at an ultra-fast speed.

Description of the Related Art

A number of techniques using plasma may be used in a thin film deposition process, an etching process for forming a pattern and the like, which are essential for productions of a semiconductor device and a display panel.

For example, in the case of the deposition process, the plasma may be used in a plasma chemical vapor deposition (PE-CVD) process, a plasma atomic layer deposition (PE-ALD) process, a sputtering process and the like, and in the case of the etching process, the plasma may be used in an inductively coupled plasma etching process, a reactive ion etching process, etc.

A process of manufacturing the semiconductor device, especially a memory integrated circuit becomes increasingly fine-sized, and there thus has been a development of its process for realizing a feature size of 3 nm or less. Therefore, the deposition and etching processes may each have increased precision and shorter process time, thereby making an on/off cycle of the plasma used also shorter.

In particular, as the semiconductor device may have an ultra-fine size of 10 nm or less, a thin film used therein may also have a thickness of several nm. In addition, recently, a structure to be etched may have a larger aspect ratio and a smaller opening, which may increase the possibility of a process change based on a state of the plasma, and many of these phenomena actually occur in a mass production line.

In a process using the plasma, arcing may occur due to a high voltage difference that may occur in a vacuum chamber, and such an arcing may cause damage to a substrate or the vacuum chamber, resulting in a huge impact on yield and productivity of the semiconductor device.

In addition, as the process time is also reduced for improving the productivity, the reproducibility and stability of the process may be lower based on the state of the plasma, and it may be necessary to set aside time for equipment maintenance due to the impact to the chamber caused by the arcing phenomenon. As a result, the productivity may be lower due to reduced time in which the equipment is used.

Therefore, in order to improve the productivity of the semiconductor device and the display panel in response to such an ultra-fine process, there is a need to detect the state of the plasma in real time to determine whether the arcing occurs.

In addition, in order to secure the reproducibility and stability of the process when performing the process using plasma technology, there is an absolute need to continuously monitor the state of the plasma. In particular, there is a growing need for securing the stability of the overall process by clearly determining whether a soft arcing occurring within a short time occurs and predicting occurrence of a hard arcing occurring due to continuity of the soft arcing in advance.

In order to solve these problems, the prior art proposes various methods for detecting the arcing which may occur in the plasma, and uses a typical technique in which threshold values of current, voltage and power, generated in the plasma, are predetermined, and then, when a measured value equal to or more than, or equal to or less than the predetermined value is detected, it is determined that the arcing occurs, and the power used to generate the plasma is blocked.

Here, a device that periodically monitors the state of the plasma may be used to detect the arcing, in which a period to detect the state of the plasma may be at a level of 1 kHz to 100 kHz (1 ms to 1 μs). This device is usable before the semiconductor device has the ultra-fine size because the device is suitable for detecting the hard arcing in which relatively large anomalies occur in voltage, current or power values, and is unsuitable for detecting the soft arcing of a predetermined level or below.

In order to determine whether the arcing occurs, the arcing duration may be required to be longer than the predetermined time (100 μs level in the prior art). In this case, it is possible to recognize the occurrence of the arcing, and to stop a function of the equipment, thereby preventing damage to the vacuum chamber being used and the device being manufactured.

In addition, the prior art mainly detects the hard arcing having a significantly large change in constant voltage, current and power, generated in the plasma. However, as described above, the ultra-fine process may require a device/technology for detecting the soft arcing having relatively small changes in the voltage, current and power.

Therefore, also required is a device/technique for detecting the soft arcing by detecting the state of the plasma at very short intervals during the process of manufacturing the semiconductor device of 10 nm or less, a micro light emitting diode (LED) display having a size of 10 μm or less, and a micro organic LED display panel.

In addition, the prior art mainly uses a method in which a probe capable of detecting the state of the plasma is inserted into the chamber, and thus necessarily requires a view port. However, there is a possibility that leakage occurs in the vacuum chamber through the corresponding view port over time and during the process, and it is difficult to use the corresponding detection device for the chamber in which the view port is not installed when the equipment is manufactured.

As such, there still are a number of problems occurring in the ultra-fine plasma process, and thus, there is a need for a method which may solve these problems more efficiently.

SUMMARY

An object of the present disclosure is to provide a multi-channel device for detecting plasma at an ultra-fast speed, in which the device may detect and guide soft arcing occurring in a plasma process in real time, and may predict hard arcing occurring based thereon.

According to an embodiment of the present disclosure, there is provided a multi-channel device for detecting plasma at an ultra-fast speed, comprising: a first antenna module connected to a first output terminal in contact with a substrate on a chuck of a process chamber and extending to ground, and receiving a first leakage current leaking through the substrate to increase reception sensitivity of the leakage current; a first current detection module detecting the first leakage current; a current measurement module receiving the first leakage current output from the first current detection module, and extracting the received first leakage current for each predetermined period to generate a first leakage current measurement information; and a control module comparing the first leakage current measurement information with a reference value to generate first arcing occurrence information.

Here, the first output terminal may be installed in a peripheral region of the substrate.

Here, when determining that an arcing occurs based on the first arcing occurrence information, the control module may determine a state of the substrate as a warpage state, and generate substrate warpage information thereon.

Here, the first current detection module may include: a 1-1-th ammeter installed between the first output terminal and the first antenna module to detect a 1-1-th leakage current leaking from the first output terminal; and a 1-2-th ammeter installed between the first antenna module and the ground to detect a 1-2-th leakage current output from the first antenna module.

Here, the current measurement module may receive the 1-1-th leakage current and the 1-2-th leakage current, and combine the leakage currents with each other to generate the first leakage current measurement information.

Here, the control module may compare the first leakage current measurement information with the reference value with reference to at least one of the amplitude, duration and pattern of the first leakage current to generate the first arcing occurrence information.

Here, the first arcing occurrence information may include at least one of soft arcing occurrence information, hard arcing prediction information and hard arcing occurrence information.

Here, the multi-channel device for detecting plasma at an ultra-fast speed may further include: a second antenna module connected to a second output terminal extending from the chuck to the ground, and receiving a second leakage current leaking from the chuck to increase reception sensitivity of the leakage current, after power is supplied to warm the chuck; a filter module connected to a rear end of the second antenna module and removing noise from the second leakage current output from the second antenna module; and a second current detection module detecting the second leakage current.

Here, the current measurement module may receive the second leakage current output from the second current detection module, and extract the received second leakage current for each predetermined period to generate second leakage current measurement information, and the control module may compare the second leakage current measurement information with the reference value to generate second arcing occurrence information.

Here, when determining that the arcing occurs based on the second arcing occurrence information, the control module may determine that the arcing occurs in the chuck, and generate arcing occurrence information of the chuck.

Here, the process chamber may further include: a view port formed to enable an inner space of the process chamber to be checked from the outside; an optical detection module collecting plasma optical information on a state of the plasma generated in the inner space of the process chamber through the view port; and an optical measurement module receiving the plasma optical information to generate optical measurement information thereon.

Here, the control module may compare the optical measurement information with the reference value to generate third arcing occurrence information.

Here, when determining that the arcing occurs based on the third arcing occurrence information, the control module may determine that the arcing occurs in the process chamber, and generate arcing occurrence information of the process chamber.

Here, the control module may compare at least two information of the first arcing occurrence information, the second arcing occurrence information and the third arcing occurrence information with each other to generate fourth arcing occurrence information of finally determining whether the arcing occurs based on whether the two information match with each other.

BRIEF DESCRIPTION OF THE DRAWINGS

FIG. 11 is a view showing table information for finally determining whether the arcing occurs by synthesizing detection results of the multi-channel devices 100, 100' and 100" for detecting plasma at an ultra-fast speed, shown in FIGS. 1 to 10.

DETAILED DESCRIPTION

Figure 1:
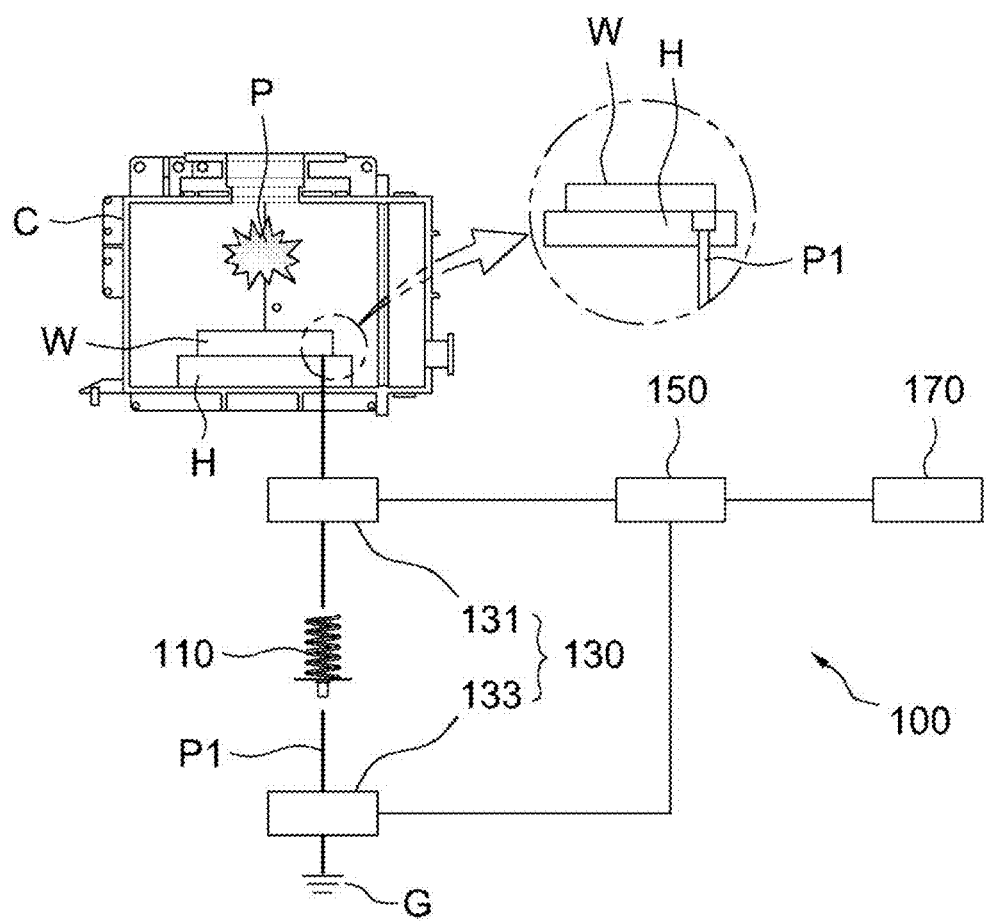
FIGS. 1 to 5B are views each showing a configuration of a multi-channel device 100 for detecting plasma at an ultra-fast speed according to an embodiment of the present disclosure, in which the device is connected to a first output terminal P1 to detect arcing occurring due to warpage of a substrate W.

Hereinafter, a multi-channel device for detecting plasma at an ultra-fast speed according to embodiments of the present disclosure is described in detail with reference to the drawings. Throughout the present specification, components that are the same as or similar to each other are denoted by reference numerals that are the same as or similar to each other and a description thereof is replaced by the first description, in different embodiments.

FIGS. 1 to 5B are views each showing a configuration of a multi-channel device 100 for detecting plasma at an ultra-fast speed according to an embodiment of the present disclosure, in which the device is connected to a first output terminal P1 to detect arcing occurring due to warpage of a substrate W.

As shown in the drawings, a process chamber C, which is a vacuum chamber used to produce a semiconductor device, a display panel or the like, is prepared in this embodiment.

The process chamber C may have an inner space, accommodate and support the substrate W such as a wafer, which is an object, on a chuck H installed in a lower portion thereof, and perform an intended etching/deposition process or the like by supplying gas and generating plasma P in this state.

Here, soft arcing, hard arcing and the like may occur due to the warpage of the large-area substrate W.

Figure 3:
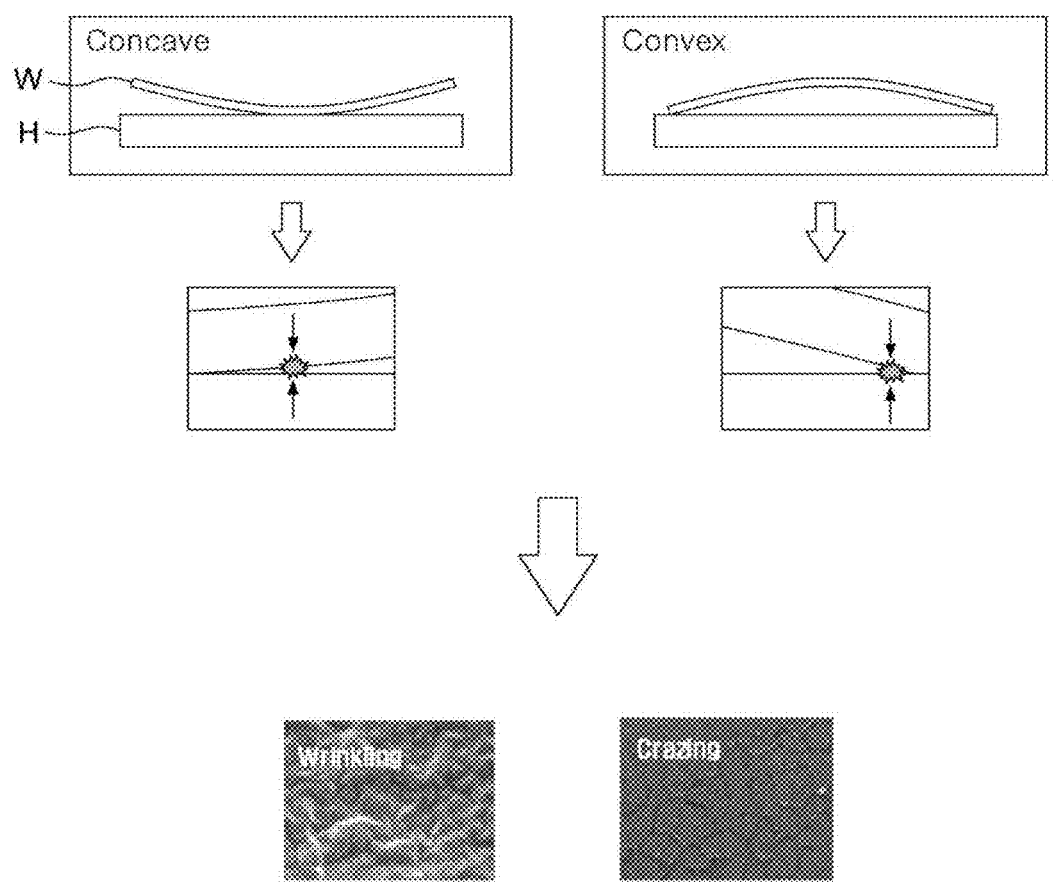
Figure 4A:
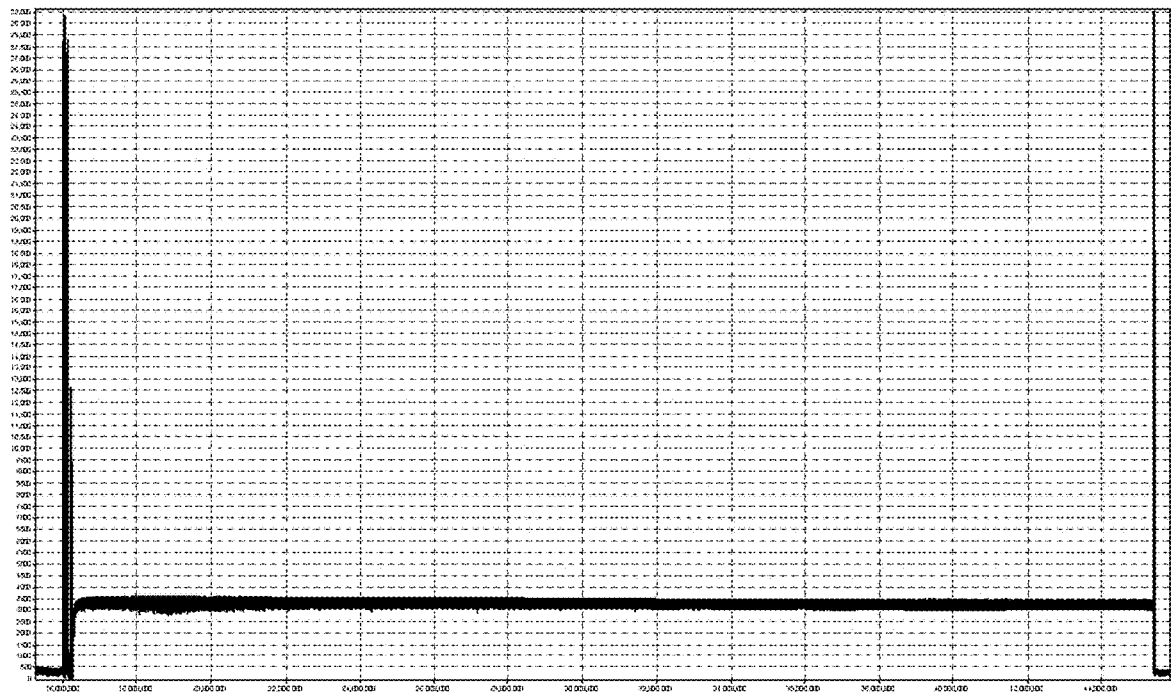
Figure 4B:
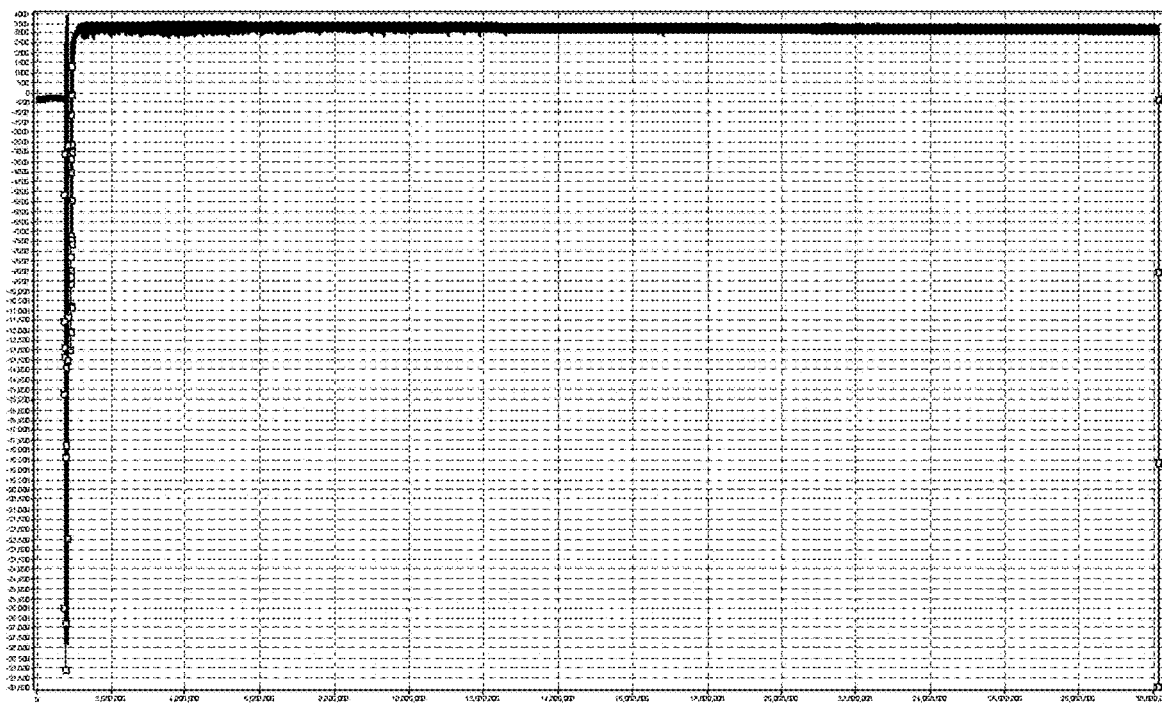
Figure 5A:
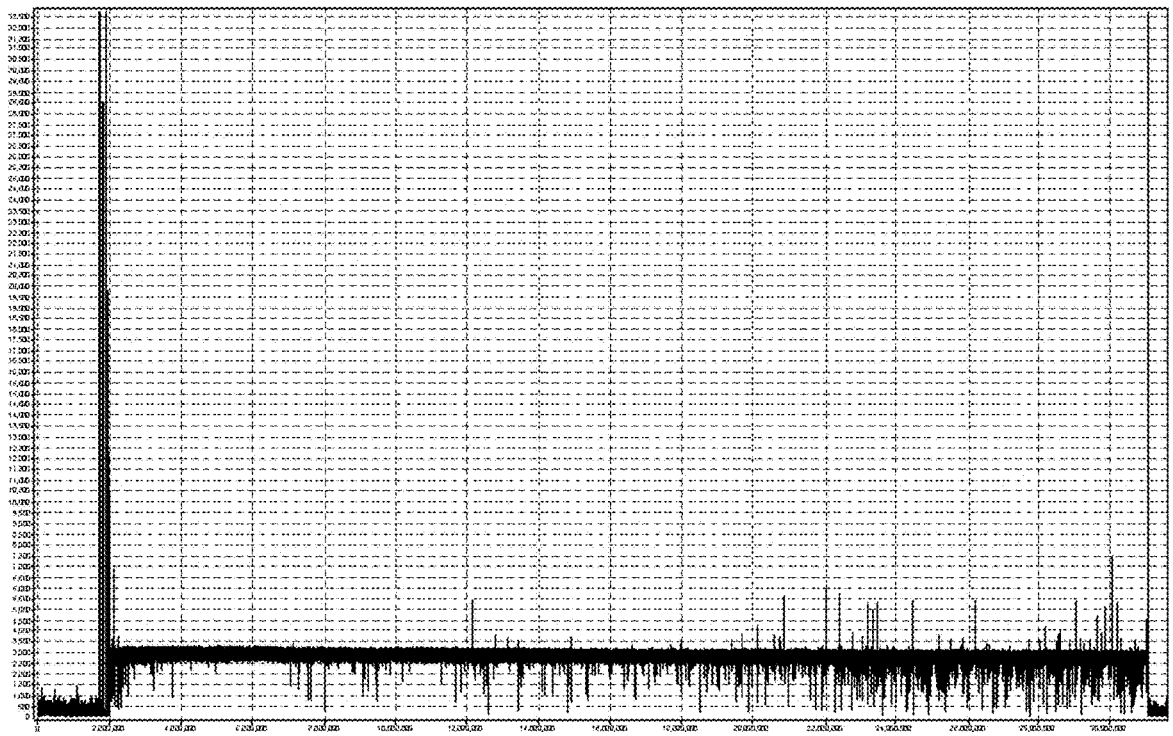
Figure 5B:
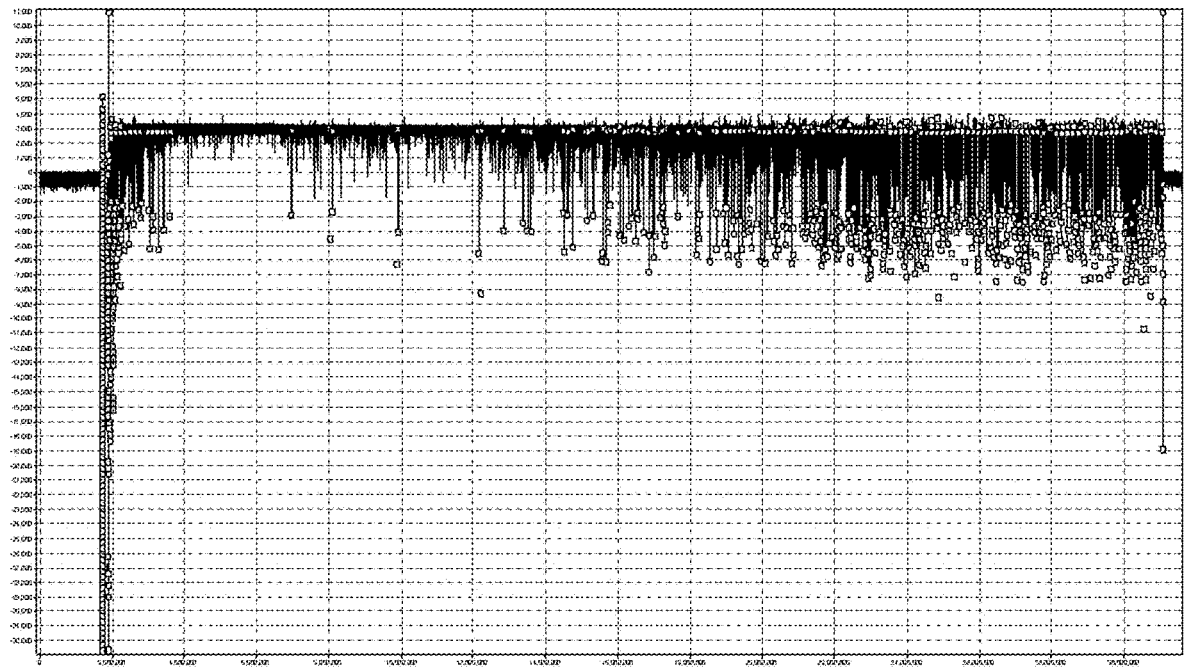

For example, when the substrate W uses a silicon (Si) substrate W of 300 mm or more as in FIG. 3, stress may be applied to a thin film by heat and the plasma P, thereby generating compressive stress or tensile stress. This stress may cause the warpage of the substrate, in which the substrate W has a concave shape concave toward its center or a convex shape convex toward its center.

If a process of the plasma P is performed in a state in which the warpage occurs on the substrate, a scratch may occur on a back side of the substrate W, and the arcing may occur when the plasma P is used in a subsequent process.

That is, when performing a photolithography process, which is a process to form a pattern on a surface of the substrate W, a light source may be defocused by a scratched damage on the back side of the substrate W, and a defect such as a wrinkling or a cracking, which is a damage to the surface of the substrate W, may occur as a result.

Therefore, to detect such a warpage of the substrate in advance, the device 100 for detecting plasma according to this embodiment may detect a leakage current of a first output terminal P1 in contact with the substrate W accommodated on the chuck H of the process chamber C, and determine whether the arcing occurs based on a detection result. This detection is possible because a first leakage current may be changed based on a state of the substrate W with respect to the chuck H while the warpage of the substrate occurs.

That is, this detection is possible because, when the warpage of the substrate occurs, a distance or shape between the substrate W and the first output terminal P1 may be changed, and the leakage current may thus be also changed. Here, one end of the first output terminal P1 positioned in the process chamber C may be installed in a peripheral region of the substrate W and may be in contact with the substrate W. The first output terminal P1 may be installed as above because when the substrate W is deformed (to be concave or convex), a change in a shape of the peripheral region may be the most obvious, and the change in leakage current may thus be large.

In addition, the other end of the first output terminal P1 may be configured to extend downward through the chuck H at the one end to be grounded to ground G. The device 100 for detecting plasma may be configured to be installed or connected to the first output terminal P1 to detect the leakage current leaking through the first output terminal P1.

To this end, the device 100 for detecting plasma may include: a first antenna module 110; a first current detection module 130; a current measurement module 150; and a control module 170.

The first antenna module 110 may be a means for increasing reception sensitivity of the first leakage current leaking between the chuck H and the substrate W, and may be installed in one region of the first output terminal P1.

Figure 2:
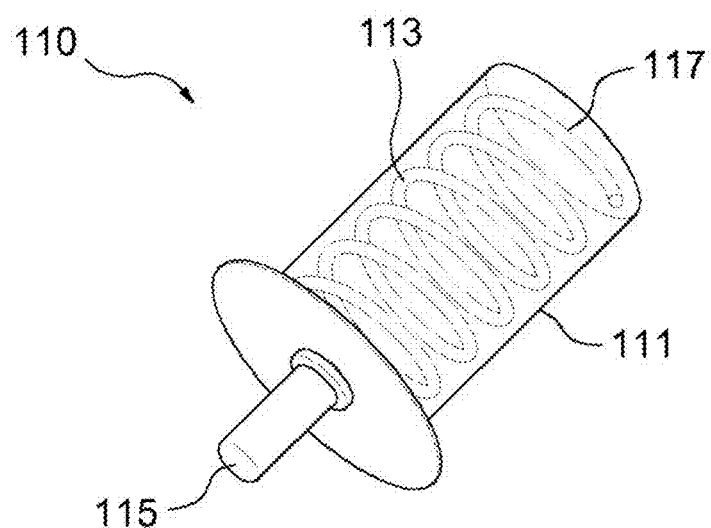

As shown in FIG. 2, the first antenna module 110 may include a cover 111, a coil 113, an input unit 115, and an output unit 117. That is, the first antenna module 110 may have a structure in which the coil 113 is wound in a spiral shape inside the cover 111, one side of the first output terminal P1 and an input unit 115 are connected to each other, and the other side of the first output terminal P1 and an output unit 117 are connected to each other. Accordingly, when a circular wave propagation with sharp directivity is radiated in an axial direction of the spiral, and the first leakage current is thus input through the input unit 115, the first antenna module 110 may receive the first leakage current with higher reception sensitivity according to the above-described principle.

The first current detection module 130 may be a means for detecting the first leakage current leaking from the first output terminal P1, and may be installed in the first output terminal P1. The first current detection module 130 may be configured of a plurality of ammeters including a 1-1-th ammeter 131 and a 1-2-th ammeter 133, and these ammeters may be installed in different regions based on the first antenna module 110 in the first output terminal P1.

That is, the 1-1-th ammeter 131 may be installed in a region of the first output terminal P1, between the chuck H and the first antenna module 110, and the 1-2-th ammeter 133 may be installed in a region of the first output terminal P1, between the first antenna module 110 and the ground G. Through this configuration, the first current detection module 130 may detect each of a 1-1-th leakage current leaking between the chuck H and the first antenna module 110 and a 1-2-th leakage current leaking between the first antenna module 110 and the ground G.

The current measurement module 150 may be a means for receiving the first leakage current output from the first current detection module 130, and extracting the received first leakage current for each period to generate first leakage current measurement information. Therefore, the current measurement module 150 may be connected to the first current detection module 130, i.e. each of the 1-1-th ammeter 131 and the 1-2-th ammeter 133, and may combine the 1-1-th leakage current and 1-2-th leakage current, each detected from these ammeters, with each other to generate the first leakage current measurement information. Here, the 1-1-th and 1-2-th leakage currents may be combined with each other by performing a calculation such as summing, subtracting and multiplying the received current values. In this embodiment, the first leakage current measurement information may be generated by the combination in which the 1-1-th and 1-2-th leakage currents are combined with each other.

When performing the combination of summing the 1-1-th and 1-2-th leakage currents as in this embodiment, this combination may amplify a received signal, and may thus derive its result value more efficiently.

The control module 170 may compare the first leakage current measurement information received from the current measurement module 150 with a reference value to generate first arcing occurrence information on whether the arcing occurs. In detail, when receiving the first leakage current measurement information, the control module 170 may compare the corresponding measured value with the reference value with reference to at least one of amplitude, duration, pattern and the like of the reference value, and generate the first arcing occurrence information based on a comparison result.

Here, the first arcing occurrence information may include soft arcing occurrence information on the arcing having short amplitude and short duration, hard arcing prediction information for predicting occurrence of the hard arcing, hard arcing occurrence information on the occurrence of the hard arcing, normal information on a normal state, etc.

As for the soft arcing occurrence information, when the received first leakage current measurement information indicates a relatively minute increase or decrease compared to the reference value for reference duration, the control module 170 may determine the corresponding state as the soft arcing occurrence information.

As for the hard arcing prediction information, when the soft arcing occurrence information lasts for reference time in which the hard arcing prediction information may be produced, the control module 170 may determine that there is a high possibility that the hard arcing occurs in the future, and generate the hard arcing prediction information as warning information thereon. That is, the soft arcing occurrence information may indicate a situation in which a current value change in a section of amplitude corresponding to the soft arcing is made only for a first duration, and the hard arcing prediction information may indicate a situation in which a current value change in a section of amplitude corresponding to the soft arcing is made for a longer time than the first duration.

As for the hard arcing occurrence information, when the first leakage current measurement information deviates from a threshold value higher than a threshold value, which is the reference value of the soft arcing, the control module 170 may determine this situation as corresponding to the hard arcing occurrence information. That is, when a phenomenon occurs for a predetermined duration, in which the received first leakage current measurement information significantly increases or decreases, the control module 170 may determine this situation as corresponding to the hard arcing occurrence information.

In addition, when the first arcing occurrence information includes the information on the occurrence of the arcing, the control module 170 may determine the state of the substrate W as a warpage state, and generate substrate warpage information thereon. That is, it is determined whether the arcing occurs based on the first leakage current occurring based on the state of the substrate W positioned on the chuck H. Therefore, when determining that the arcing occurs, the device 100 for detecting plasma according to this embodiment may determine that the corresponding substrate W is also in the warpage state.

The device 100 having such a configuration for detecting plasma may detect the first leakage current leaking through the first output terminal P1 in contact with the substrate W on the chuck H. When the first leakage current is changed due to the warpage of the substrate W, the device 100 may thus determine the current and future states of the substrate W in real time based on the detection result. Therefore, the device 100 may prevent any additional damage to the substrate W and a process delay in advance by transmitting and guiding its determination result to an administrator terminal through a communication module (not shown) or the like or as a warning sound, or by generating control information for automatically controlling an operation of the process chamber C and transmitting the same. In addition, the device 100 may be configured to store and transmit all information generated between these processes to a memory module, database, external server, and the like (not shown) to generate and manage history information for each situation.

The above description describes the device 100 for detecting plasma, in which the device detects the arcing occurring due to the warpage of the substrate W. Hereinafter, the description describes a configuration of a device for detecting plasma, in which the device detects whether the arcing occurs based on a leakage current of power supplied to the chuck H with reference to FIGS. 6 to 9C.

FIGS. 6 to 9C are views each showing a configuration of a multi-channel device 100' for detecting plasma at an ultra-fast speed according to another embodiment of the present disclosure, in which the device is connected to a second output terminal P2.

The device 100' for detecting plasma according to this embodiment includes the configuration of the device 100 for detecting plasma (see FIG. 1) of the previous embodiment, and the description thus focuses on newly added components.

Figure 6:
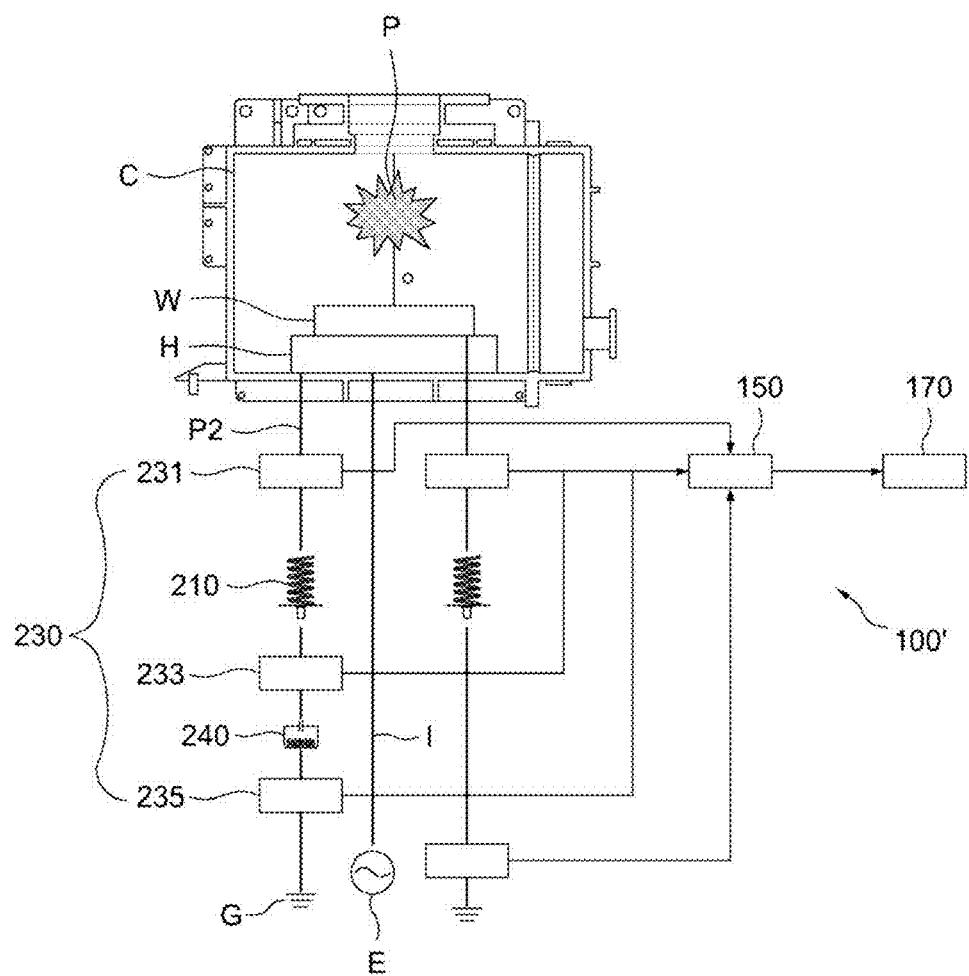
FIGS. 6 to 9C are views each showing a configuration of a multi-channel device 100' for detecting plasma at an ultra-fast speed according to another embodiment of the present disclosure, in which the device is connected to a second output terminal P2.
Figure 7A:
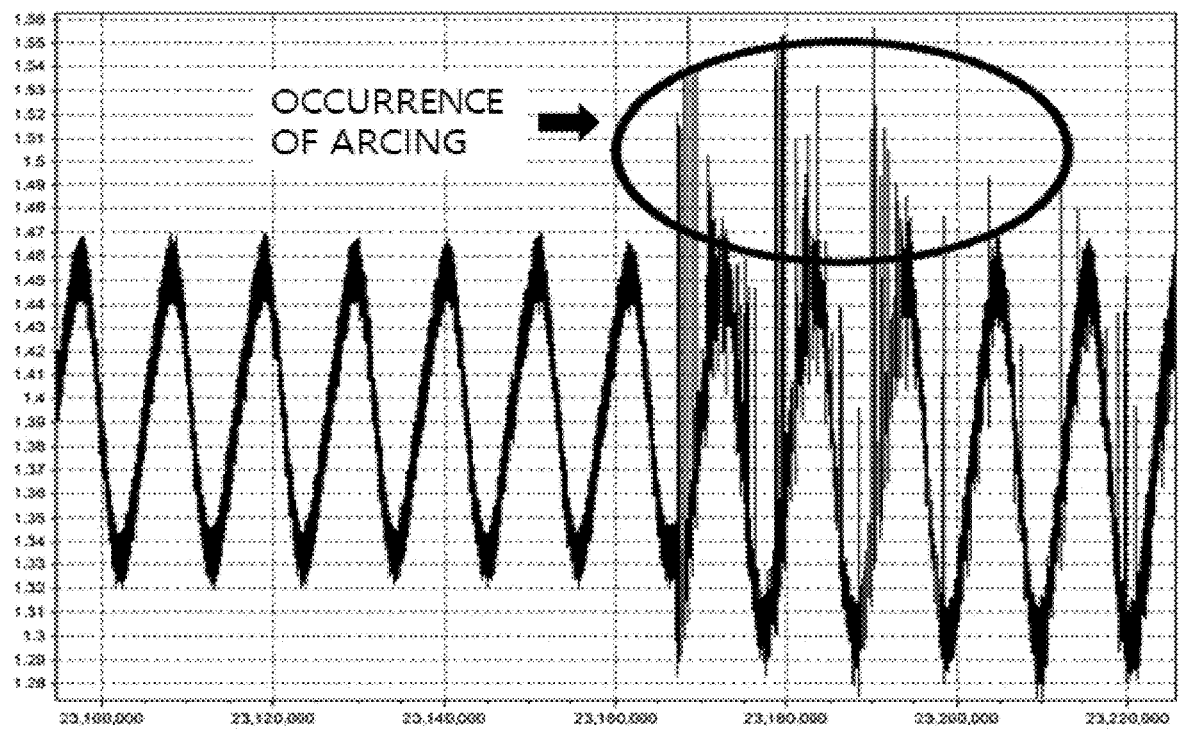
Figure 7B:
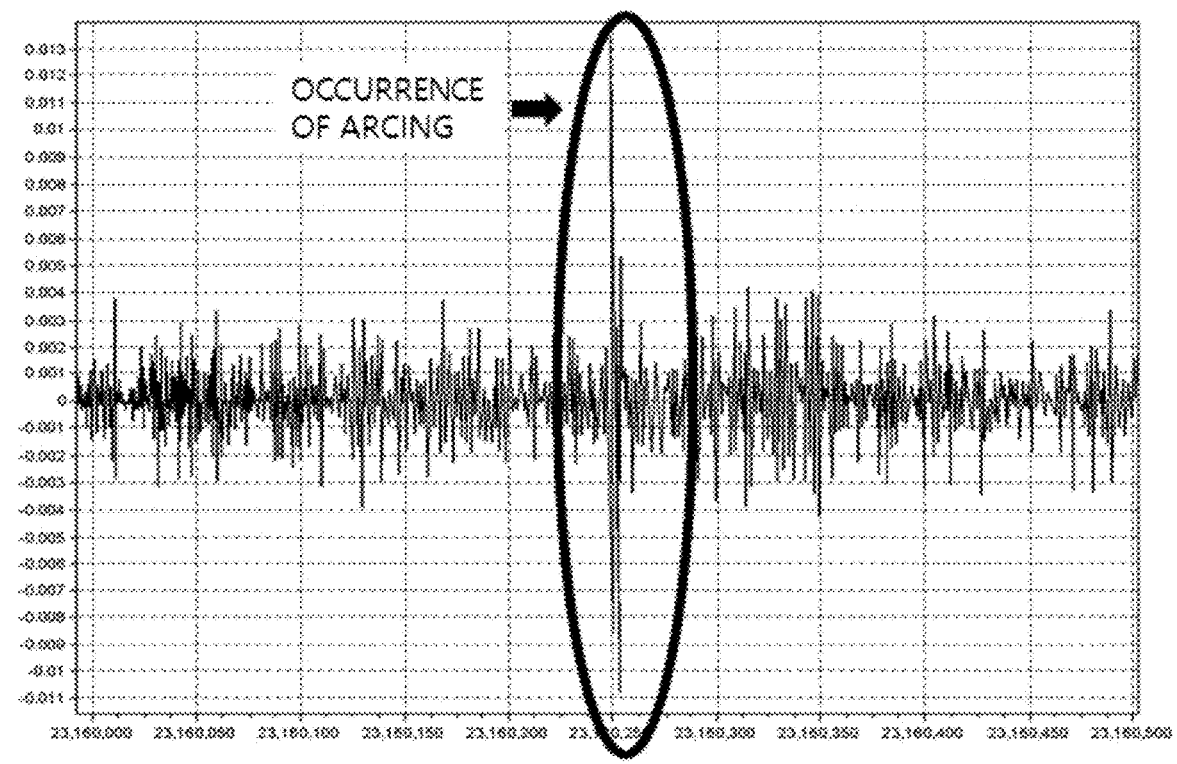

As shown in FIG. 6, the process chamber C in this embodiment may be connected to a power module E that supplies power to warm the chuck H through an input terminal I. That is, one end of the input terminal I may be connected to the power module E, and the other end of the input terminal I may be connected to the chuck H (heater chuck) to supply the power to the chuck H. In addition, the device 100' may include the second output terminal P2, in which one end of the second output terminal P2 is connected to the chuck H and the other end thereof may be grounded to the ground G. As such, the power may be supplied to warm the chuck H through the input terminal I, and a second leakage current leaking from the chuck H may be transferred to the ground G through the second output terminal P2.

Based on this configuration, the device 100' for detecting plasma may detect the second leakage current leaking to the second output terminal P2, and determine whether the arcing occurs by comparing a detection result with the reference value. That is, this embodiment is different from the previous embodiment because the previous embodiment describes the method of detecting the leakage current leaking from the substrate W with reference to FIGS. 1 to 5, whereas this embodiment describes a method of detecting the leakage current leaking from the chuck H.

To this end, the device 100' for detecting plasma according to this embodiment may further include: a second antenna module 210; a filter module 240; and a second current detection module 230. The current measurement module 150 and the control module 170 correspond to those of the configuration of the previous embodiment, and the description omits a separate additional description thereof.

The second antenna module 210 may serve the same function as the above-described first antenna module 110, and may be installed in the second output terminal P2 to increase reception sensitivity of the second leakage current leaking through the second output terminal P2.

The filter module 240 is a means for removing noise from the second leakage current, and any of various known filter circuits may be applied thereto. The filter module 240 may be installed in the second output terminal P2, and in more detail, may be installed in a region of the second output terminal P2, between the second antenna module 210 and the ground G.

The second current detection module 230 may have the same configuration and operation as the first current detection module 130 described above, and may be installed in the second output terminal P2 to detect the second leakage current. Here, the second current detection module may be configured of a plurality of ammeters including a 2-1-th ammeter 231, a 2-2-th ammeter 233 and a 2-3-th ammeter 235. Each ammeter may be installed in the region of the second output terminal P2, i.e. between the chuck H and the second antenna module 210, between the second antenna module 210 and the filter module 240, between the filter module 240 and the ground G, in sequence.

Based on this configuration, when detecting the second leakage current, the current measurement module 150 may extract the detected second leakage current for each period to generate second leakage current measurement information. In addition, the control module 170 may receive the second leakage current measurement information and compare the received information with the reference value to generate second arcing occurrence information on whether the arcing occurs.

Here, the second leakage current measurement information may be generated by a combination of 2-1-th, 2-2-th and 2-3-th leakage currents detected by the 2-1-th, 2-2-th and 2-3-th ammeters.

The second arcing occurrence information may be configured in the same manner as the first arcing occurrence information.

In addition, when determining that the arcing occurs based on the second arcing occurrence information, the control module 170 may determine that the arcing occurs in the chuck H, and thus generate arcing occurrence information of the chuck H.

As shown in FIGS. 8A to 9C, the control module 170 may analyze the received second leakage current measurement information to detect amplitude of the second leakage current with an initial period of 20 microseconds (μs). When the amplitude of the second leakage current deviates from the threshold value corresponding to the soft arcing, the control module 170 may analyze the corresponding result with an expanded period of 25 nanoseconds (ns). That is, the control module 170 may perform a monitoring to detect the second leakage current for every 25 ns and a general monitoring for every 20 μs. When there is a possibility that the arcing occurs (i.e. the measured value is out of the reference value), the control module 170 may analyze the corresponding region with the expanded period of 25 ns to perform the determination.

Figure 8A:
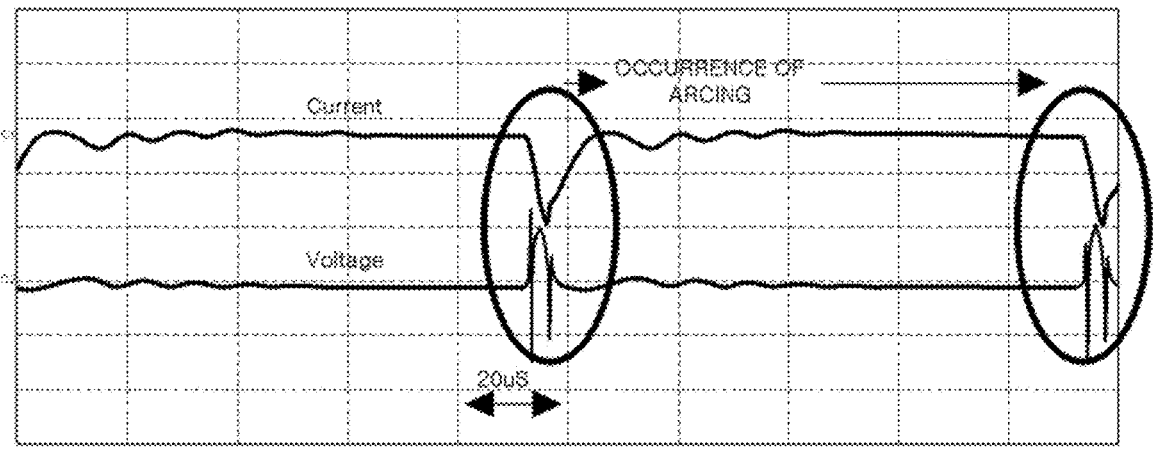
Figure 8B:
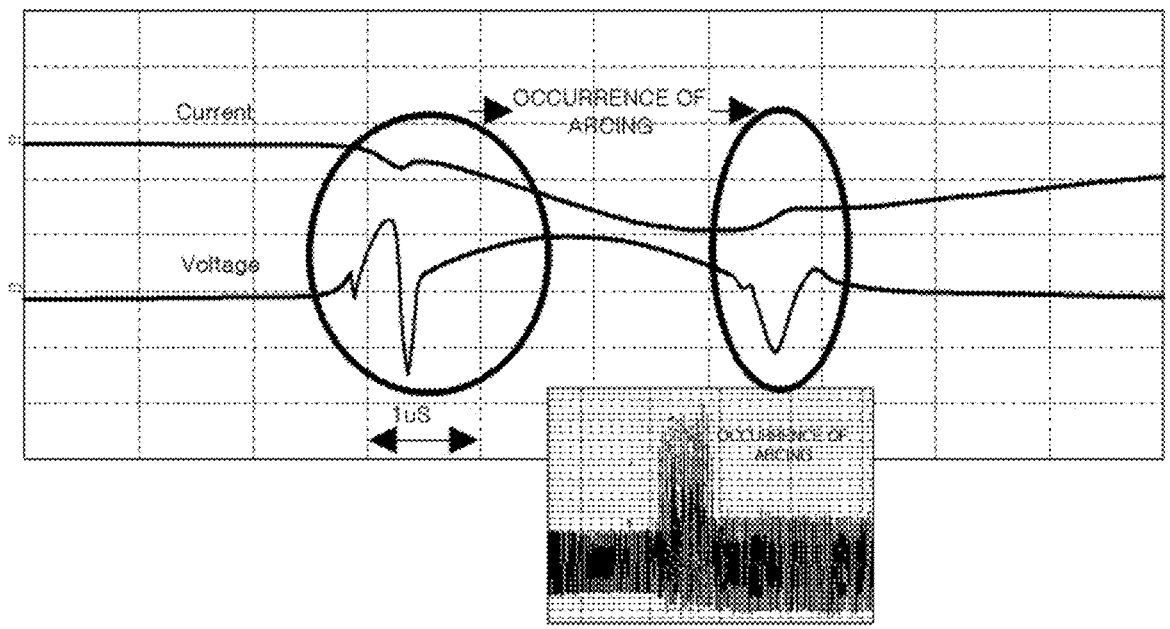
Figure 9A:
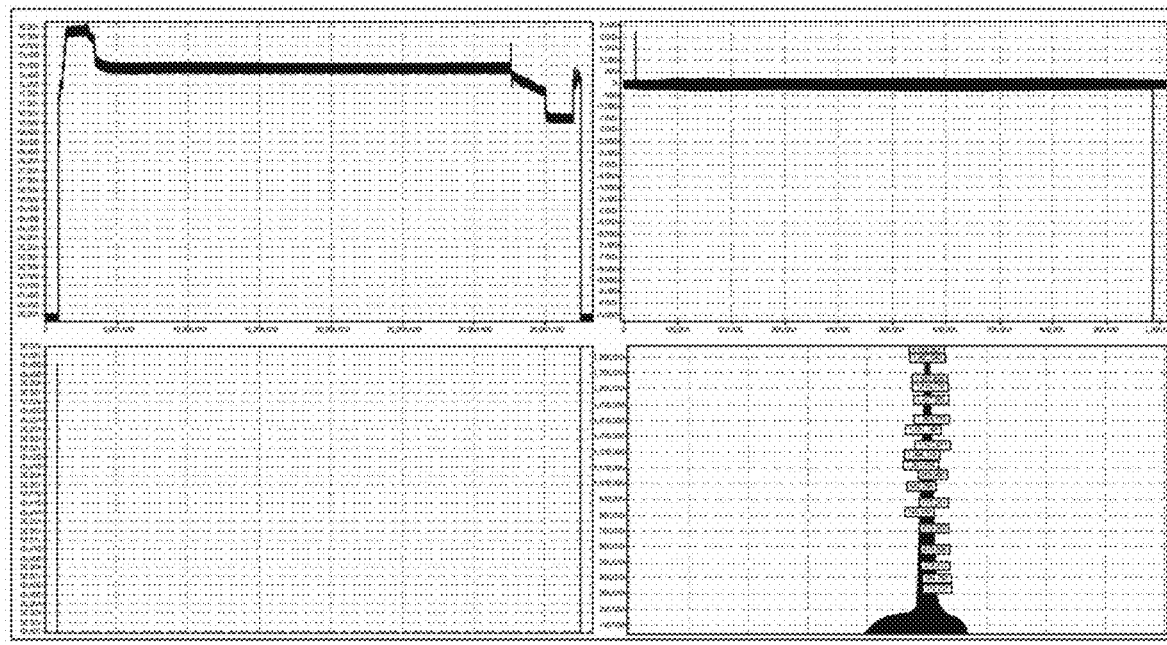
Figure 9B:
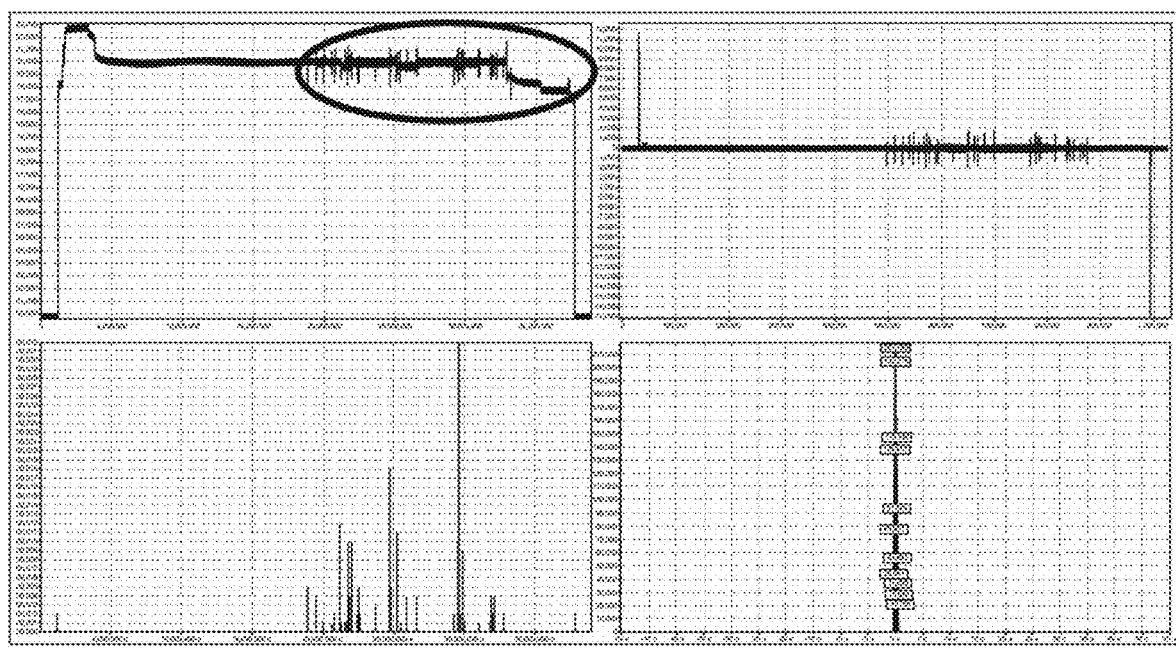

FIG. 9A shows the period and amplitude of the current in a situation in which the arcing does not occur based on he second leakage current measurement information. FIG. 8B shows the period and amplitude of the current in a situation in which the soft arcing occurs. That is, when the soft arcing occurs, current value fluctuation in the current value may occur for a predetermined period of time. The maximum and minimum values of the fluctuation here may be included in a range of the predetermined reference value of the soft arcing. In the case of the soft arcing, the range of the current value fluctuation may be relatively small.

Figure 9C:
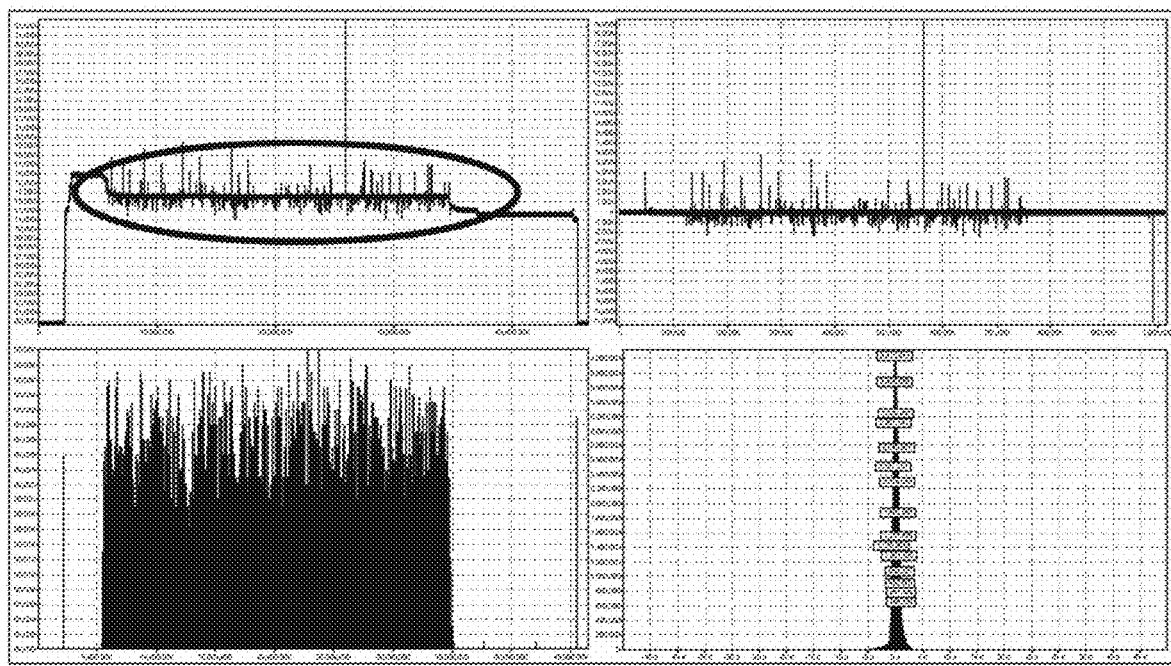

FIG. 9C shows a case in which the hard arcing occurs, and it may be seen that a relatively rapid change in the current value occurs compared to the soft arcing. Therefore, the control module 170 may predetermine each of the reference values corresponding to the soft arcing and the hard arcing, and may determine arcing states such as the soft arcing occurrence state, the hard arcing prediction state, the hard arcing occurrence state, and the normal state by comparing the respective reference values with each other.

The above description describes the device 100' for detecting plasma, in which the device detects the arcing based on the second leakage current leaking through the powered chuck H. Hereinafter, the description describes a device for detecting plasma in which the device detects the occurrence of the arcing using an optical means with reference to FIG. 10.

Figure 10:
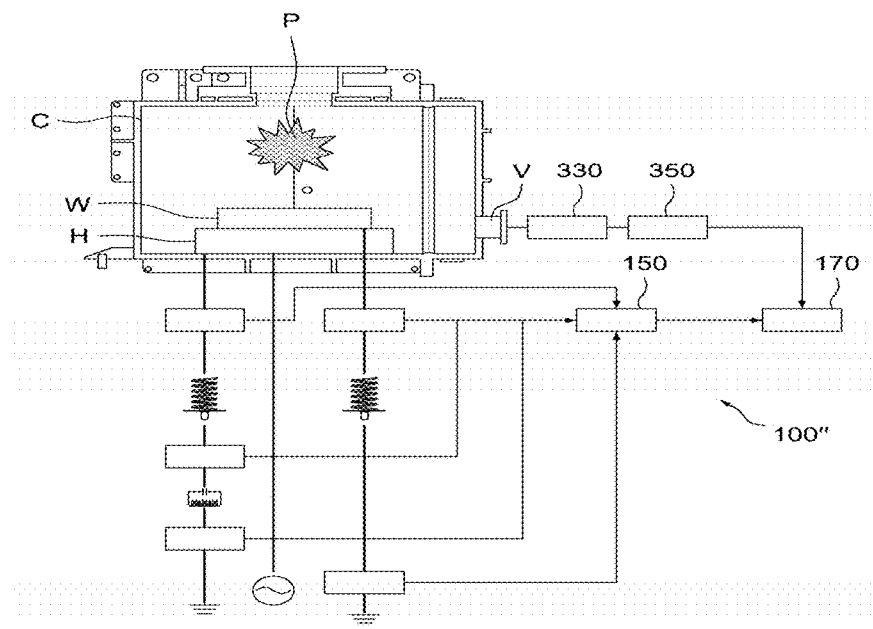
FIG. 10 is a view showing a configuration of a multi-channel device 100" for detecting plasma at an ultra-fast speed according to yet another embodiment of the present disclosure, in which the device includes an optical arcing-detection means.

FIG. 10 is a view showing a configuration of a multi-channel device 100" for detecting plasma at an ultra-fast speed according to yet another embodiment of the present disclosure, in which the device includes an optical arcing-detection means.

As shown in the drawing, the device 100" for detecting plasma of FIG. 10 may have a detection method different from those of the previous embodiments. In detail, the device 100" for detecting plasma according to this embodiment may detect the plasma P in the inner space of the process chamber C in an optical manner to determine whether the arcing occurs.

As for the device 100" for detecting plasma in an optical manner, the process chamber C may include a view port V formed to enable the inner space to be checked from the outside. Therefore, the device 100" may perform an optical detection through the corresponding view port V.

In detail, the device 100" for detecting plasma according to this embodiment may include an optical detection module 330 and an optical measurement module 350.

The optical detection module 330 may collect plasma optical information on a state of the plasma P generated in the inner space of the process chamber C through the view port V. Gas dissociated by the plasma P in the inner space of the process chamber C may have its own wavelength (color) differently emitted based on a change in the state of the plasma P, and when the plasma P enters an abnormal state, light emitted therefrom may have the changed color and wavelength. Therefore, the optical detection module 330 may collect the plasma optical information on the color of the plasma P through the view port V.

The optical measurement module 350 may generate optical measurement information obtained by dividing the plasma optical information received from the optical detection module 330 for each wavelength band. That is, the optical measurement module 350 may classify the received plasma optical information for each wavelength of 200 to 1100 nm including the ultraviolet-visible-infrared regions and thus generate the optical measurement information.

When receiving the optical measurement information from the optical measurement module 350, the control module 170 may compare the information with the reference value which is reference wavelength information in a normal state to generate third arcing occurrence information.

In addition, when determining that the arcing occurs based on the third arcing occurrence information, the control module 170 may determine that the arcing occurs in the process chamber C, and thus generate the arcing occurrence information of the process chamber.

As such, the device 100" for detecting plasma according to this embodiment may determine whether the arcing occurs by optically observing the plasma P generated in the process chamber C.

The above description describes the device 100" for detecting plasma in the optical manner, and the description describes hereinafter a method of determining whether the arcing occurs by combining the respective detection results of the above-described embodiments with each other.

FIG. 11 is a view showing table information for finally determining whether the arcing occurs by synthesizing detection results of the multi-channel devices 100, 100' and 100" for detecting plasma at an ultra-fast speed, shown in FIGS. 1 to 10.

The previous embodiments describe the methods of detecting different objects as targets, such as detecting the first leakage current of the substrate W, detecting the second leakage current of the chuck H, and optically detecting the plasma P. These detection methods may be individually used. However, it is possible to obtain a more reliable detection result when these methods are implemented in a multi-channel and complex manner.

That is, the control module 170 may match the first, second and third arcing occurrence information generated by the respective configurations with each other, and generate fourth arcing occurrence information which is a result of a final determination as to whether the arcing occurs based on a matching result.

As shown in FIG. 11, the first, second and third arcing occurrence information may be generated for respective sequential states. Here, at least two arcing occurrence information may be matched with each other to derive a fourth arcing occurrence result, which is a final determination result based on the matching result.

FIG. 11 shows all of the first, second and third arcing occurrence information, which is only for overall explanation of the present disclosure. In practice, a method may be used in which the leakage currents of the substrate W and the chuck H and the optical information on the plasma P are matched with one another.

For example, it is possible to compare the first arcing occurrence information on whether the arcing occurs in the substrate W and the third arcing occurrence information on whether the arcing occurs on the basis of the plasma P with each other, and to compare the second arcing occurrence information on whether the arcing occurs in the chuck H and the third arcing occurrence information on whether the arcing occurs on the basis of the plasma P with each other, respectively.

Here, the first arcing occurrence information generated on the basis of the substrate W may include information on the occurrence of the arcing, and the third arcing occurrence information generated on the basis of the plasma P, compared to this information, may also include the information on the occurrence of the arcing. In this case, it is possible to clearly determine the corresponding situation as the situation in which the arcing occurs, and to generate the related fourth arcing occurrence information.

Meanwhile, although the substrate W is determined to be in the normal state based on the first arcing occurrence information or the second arcing occurrence information, the detection result based on the third arcing occurrence information may indicate the occurrence of the soft arcing. This situation may have a relatively high possibility of the normal state or the occurrence of the soft arcing, and it is thus possible to generate the fourth arcing occurrence information corresponding to the reference table information by synthesizing this information together.

As such, the arcing occurrence information may be extracted for each of the substrate W, the chuck H and the plasma P, and the final result may thus be generated by matching the extracted results with each other, thereby further improving reliability of the final arcing occurrence information. In addition, all information generated in this series of processes may be stored and managed as the history information, and a fixed process may be automatically controlled based on the arcing occurrence information, thereby improving efficiency of the overall process.

The multi-channel device for detecting plasma at an ultra-fast speed as described above is not limited to the configurations and operation methods of the above-described embodiments. The above-described embodiments may be configured for various modifications to be made by selective combinations of all or some of the respective embodiments.

According to the multi-channel device for detecting plasma at an ultra-fast speed of the present disclosure having the above configuration, it is possible to improve efficiency of determining whether the arcing occurs due to the plasma in the chamber.

In addition, it is possible to detect the soft arcing occurring for a short time by improving the reception sensitivity of the leakage current through the antenna.

In addition, it is possible to further improve accuracy in the arcing detection through the arcing detection in various positions and methods.

In addition, it is possible to further improve the reliability of the result value by matching the plurality of results of the arcing detections with each other to finally determine whether the arcing occurs.

In addition, it is possible to prevent the hard arcing in advance by predicting the occurrence of the hard arcing based on the occurrence or not and duration of the soft arcing and providing a guidance thereto.

What is claimed is:

1. A multi-channel device for detecting plasma at an ultra-fast speed, comprising:
    a first antenna module connected to a first output terminal in contact with a substrate on a chuck of a process chamber and extending to ground, and receiving a first leakage current leaking through the substrate to increase reception sensitivity of the first leakage current;
    a first current detection module detecting the first leakage current;
    a current measurement module receiving the first leakage current output from the first current detection module, and extracting the received first leakage current for each predetermined period to generate a first leakage current measurement information; and
    a control module comparing the first leakage current measurement information with a reference value to generate first arcing occurrence information;
    wherein the first current detection module includes:
        a 1-1-th ammeter installed between the first output terminal and the first antenna module to detect a 1-1-th leakage current leaking from the first output terminal; and
        a 1-2-th ammeter installed between the first antenna module and the ground to detect a 1-2-th leakage current output from the first antenna module.

2. The multi-channel device for detecting plasma at an ultra-fast speed of claim 1, wherein the first output terminal is installed in a peripheral region of the substrate.

3. The multi-channel device for detecting plasma at an ultra-fast speed of claim 1, wherein when determining that an arcing occurs based on the first arcing occurrence information, the control module determines a state of the substrate as a warpage state, and generates substrate warpage information thereon.

4. The multi-channel device for detecting plasma at an ultra-fast speed of claim 1, wherein the current measurement module receives the 1-1-th leakage current and the 1-2-th leakage current, and combines the 1-1-th and the 1-2-th leakage currents with each other to generate the first leakage current measurement information.

5. The multi-channel device for detecting plasma at an ultra-fast speed of claim 1, wherein the control module compares the first leakage current measurement information with the reference value with reference to at least one of the amplitude, duration and pattern of the first leakage current to generate the first arcing occurrence information.

6. The multi-channel device for detecting plasma at an ultra-fast speed of claim 1, wherein the first arcing occurrence information includes at least one of soft arcing occurrence information, hard arcing prediction information and hard arcing occurrence information.

7. The multi-channel device for detecting plasma at an ultra-fast speed of claim 1, wherein the process chamber further includes:
    a view port formed to enable an inner space of the process chamber to be checked from the outside;

an optical detection module collecting plasma optical information on a state of the plasma generated in the inner space of the process chamber through the view port; and an optical measurement module receiving the plasma optical information to generate optical measurement information thereon.

8. The multi-channel device for detecting plasma at an ultra-fast speed of claim 7, wherein the control module compares the optical measurement information with an optical reference value to generate third arcing occurrence information.

9. The multi-channel device for detecting plasma at an ultra-fast speed of claim 8, wherein when determining that the arcing occurs based on the third arcing occurrence information, the control module determines that the arcing occurs in the process chamber, and generates arcing occurrence information of the process chamber.

10. A multi-channel device for detecting plasma at an ultra-fast speed, comprising:
   a first antenna module connected to a first output terminal in contact with a substrate on a chuck of a process chamber and extending to ground, and receiving a first leakage current leaking through the substrate to increase reception sensitivity of the first leakage current;
   a first current detection module detecting the first leakage current;
   a current measurement module receiving the first leakage current output from the first current detection module, and extracting the received first leakage current for each predetermined period to generate a first leakage current measurement information;
   a control module comparing the first leakage current measurement information with a reference value to generate first arcing occurrence information;
   a second antenna module connected to a second output terminal extending from the chuck to the ground, and receiving a second leakage current leaking from the chuck to increase reception sensitivity of the second leakage current, after power is supplied to warm the chuck;
   a filter module connected to a rear end of the second antenna module and removing noise from the second leakage current output from the second antenna module; and
   a second current detection module detecting the second leakage current.

11. The multi-channel device for detecting plasma at an ultra-fast speed of claim 10, wherein the current measurement module receives the second leakage current output from the second current detection module, and extracting the received first leakage current for each predetermined period to generate second leakage current measurement information, and
   the control module compares the second leakage current measurement information with the reference value to generate second arcing occurrence information.

12. The multi-channel device for detecting plasma at an ultra-fast speed of claim 11, wherein when determining that the arcing occurs based on the second arcing occurrence information, the control module determines that the arcing occurs in the chuck, and generates arcing occurrence information of the chuck.

13. A multi-channel device for detecting plasma at an ultra-fast speed, comprising:
   a first antenna module connected to a first output terminal in contact with a substrate on a chuck of a process chamber and extending to ground, and receiving a first leakage current leaking through the substrate to increase reception sensitivity of the first leakage current;
   a first current detection module detecting the first leakage current;
   a current measurement module receiving the first leakage current output from the first current detection module, and extracting the received first leakage current for each predetermined period to generate a first leakage current measurement information;
   a control module comparing the first leakage current measurement information with a reference value to generate first arcing occurrence information;
   a second antenna module connected to a second output terminal extending from the chuck to the ground, and receiving a second leakage current leaking from the chuck to increase reception sensitivity of the second leakage current, after power is supplied to warm the chuck;
   a filter module connected to a rear end of the second antenna module and removing noise from the second leakage current output from the second antenna module; and
   a second current detection module detecting the second leakage current,
   wherein the process chamber further includes:
      a view port formed to enable an inner space of the process chamber to be checked from the outside;
      an optical detection module collecting plasma optical information on a state of the plasma generated in the inner space of the process chamber through the view port; and
      an optical measurement module receiving the plasma optical information to generate optical measurement information thereon;
   wherein the current measurement module receives the second leakage current output from the second current detection module, and extracts the received second leakage current for each predetermined period to generate second leakage current measurement information,
   wherein the control module compares the optical measurement information with an optical reference value to generate third arcing occurrence information;
   the control module compares the second leakage current measurement information with the second reference value to generate second arcing occurrence information, and
   the control module compares at least two information of the first arcing occurrence information, the second arcing occurrence information and the third arcing occurrence information with each other to generate fourth arcing occurrence information of finally determining whether the arcing occurs based on whether the two information match with each other.

* * * * *